United States Patent
Haba

(10) Patent No.: US 6,190,509 B1
(45) Date of Patent: Feb. 20, 2001

(54) METHODS OF MAKING ANISOTROPIC CONDUCTIVE ELEMENTS FOR USE IN MICROELECTRONIC PACKAGING

(75) Inventor: Belgacem Haba, Cupertino, CA (US)

(73) Assignee: Tessera, Inc., San Jose, CA (US)

( * ) Notice: Under 35 U.S.C. 154(b), the term of this patent shall be extended for 0 days.

(21) Appl. No.: 09/034,515

(22) Filed: Mar. 4, 1998

Related U.S. Application Data

(60) Provisional application No. 60/040,021, filed on Mar. 4, 1997.

(51) Int. Cl.$^7$ .............................. H05F 3/00; G02F 1/1337; B29C 67/00; H05B 6/00
(52) U.S. Cl. ......................... 204/164; 349/191; 264/108; 264/437; 264/438
(58) Field of Search ........................... 204/164; 349/191; 264/108, 437, 438

(56) References Cited

U.S. PATENT DOCUMENTS

| | | | |
|---|---|---|---|
| 3,841,732 | * 10/1974 | Marks | 350/160 R |
| 4,667,401 | * 5/1987 | Clements et al. | 29/832 |
| 5,282,312 | 2/1994 | DiStefano et al. | 29/830 |
| 5,389,408 | * 2/1995 | DeVolk | 427/559 |
| 5,394,149 | * 2/1995 | Fujita et al. | 342/1 |
| 5,522,962 | * 6/1996 | Koskenmaki et al. | 156/272.4 |
| 5,627,405 | 5/1997 | Chillara | 257/668 |

OTHER PUBLICATIONS

Webster's Ninth Collegiate Dictionary, p. 475*, c.1985.*
*no month available.*

* cited by examiner

*Primary Examiner*—Edna Wong
(74) *Attorney, Agent, or Firm*—Lerner, David, Littenberg, Krumholz & Mentlik, LLP

(57) ABSTRACT

A method of making an anisotropic conductive element for use in microelectronic packaging includes providing a layer of an anisotropic conductive material incorporating a dielectric material in a fluid condition and electrically conductive particles in the dielectric material and applying a field to the anisotropic conductive material so as to alter the configuration of the particles. The layer has a pair of oppositely directed major faces, a vertical direction between the major faces and horizontal directions parallel to the major faces. The field applied to the layer of anisotropic conductive material may include electrical or magnetic fields. In certain embodiments, at last some of the conductive particles are elongated so that when the field is applied to the layer of anisotropic conductive material, the field turns the axes of elongation of at least some of the elongated particles towards the vertical direction. In other embodiments the field moves at least some of the conductive particles in horizontal directions.

27 Claims, 12 Drawing Sheets

METHODS OF MAKING ANISOTROPIC CONDUCTIVE ELEMENTS FOR USE IN MICROELECTRONIC PACKAGING

CROSS REFERENCE TO RELATED APPLICATIONS

This application claims benefit of U.S. Provisional Application Ser. No. 60/040,021 filed Mar. 4, 1997, the disclosure of which is hereby incorporated by reference herein.

FIELD OF THE INVENTION

The present invention relates to the field of semiconductor chip mounting and connection, and more particularly relates to methods of making anisotropic conductive elements for use in microelectronic packages.

BACKGROUND OF THE INVENTION

Modern electronic devices utilize semiconductor components, commonly referred to as "integrated circuits," which incorporate numerous electronic elements. These chips are typically mounted on substrates that physically support the chips and electrically interconnect each chip with other elements of the circuit. The substrate may be part of a discrete chip package, such as a single chip module or a multi-chip module, or may be a circuit board. The chip module or circuit board is typically incorporated into a large circuit. An interconnection between the chip and the chip module is commonly referred to as a "first level" assembly or chip interconnection. An interconnection between the chip module and a printed circuit board or card is commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip.

The rapid evolution of the semiconductor art in recent years has created an intense demand for semiconductor chip packages having progressively greater numbers of contacts in a given amount of space. An individual chip may require hundreds or even thousands of contacts, all within the area of the front face of the chip. Certain complex semiconductor chips currently being used have contacts spaced apart from one another at center-to-center distances of 0.1 mm or less and, in some cases, 0.05 mm or less.

One method utilized to interconnect semiconductor chips having closely spaced contacts includes using anisotropic conductive material. In U.S. Pat. No. 5,627,405, issued May 6, 1997, Chillara discloses an integrated circuit assembly comprising an integrated circuit, a dielectric substrate and an anisotropic electrically conductive layer interposed between the dielectric substrate and the integrated circuit. The anisotropic electrically conductive layer is electrically conductive in directions that are parallel to an electrically conductive axis and is electrically insulative in other directions.

However, there continues to be a need for improvement in elements and methods of making anisotropic conductive elements for use in microelectronic packaging.

SUMMARY OF THE INVENTION

In one preferred embodiment of the present invention, a method of making an anisotropic conductive element for use in microelectronic packaging includes the step of providing a layer of an anisotropic conductive material incorporating a dielectric material, such as a polymeric material or a curable silicone elastomer. The layer of anisotropic conductive material preferably includes a plurality of electrically conductive particles in the dielectric material. The dielectric material is preferably provided in a fluid or uncured condition. The dielectric material may be made more fluid by heating the anisotropic conductive material so that the viscosity of the material is reduced whereby the electrically conductive particles are relatively more free to move throughout the layer. The layer of anisotropic conductive material preferably has a pair of oppositely-directed major faces, a vertical direction between the major faces and horizontal directions parallel to the major faces.

The electrically conductive particles may include metal, such as solid metal balls, or elongated metal particles such as particles having longitudinal axes. The electrically conductive particles may also include elements having non-conductive cores which are coated with a layer of a conductive material. The non-conductive cores may include epoxy or other polymers, glass or silicone. Preferably, the conductive layers are provided uniformly about the cores.

A field is preferably applied to the layer of anisotropic conductive material so as to alter the configuration of the electrically conductive particles. The applied field may include an electrical field, a magnetic field or a combined electrical and magnetic field applied to the layer. In one preferred embodiment, the applying a field step includes biasing said first and second major faces with a different electrical potentials on at least some regions of the major faces. The electrically conductive particles preferably have longitudinal axes whereby the application of the electrical field turns the axes of elongation of at least some of the elongated particles toward the vertical direction. As a result, at least some of the electrically conductive particles are positioned in a substantially vertical direction between the major faces. Where the vertical dimension or thickness of the layer is larger than the longitudinal dimension of the particles, application of the field may bring some of the particles to a generally end-to-end disposition. The application of the field may also move at least some of the particles in horizontal directions so as to form areas of high particle concentration interspersed with areas of low particle concentration. The effects of turning the axes of elongation of at least some of the elongated conductive particles toward the vertical direction and moving at least some of the conductive particles in horizontal directions may be combined to provide areas of high particle concentration which generally include vertically-arrayed conductive particles which are closely congregated with one another. The areas of high particle concentration facilitate the conduction of electrical signals through the layer, from one major face of the layer to the second oppositely directed major face of the layer.

After the field has been applied to the layer of anisotropic conductive material so as to alter the configuration of the particles, the dielectric material is set or cured so that the dielectric material transforms into a non-fluid condition whereby the electrically conductive particles are substantially secured or frozen in place. In other words, the conductive particles are relatively less mobile throughout the dielectric material after the dielectric material has been set. However, in other embodiments the application of heat to set the curable dielectric material may occur simultaneously with the application of a field, such as an electric field.

The application of the magnetic or electrical field to the layer of anisotropic conductive material programs the layer preferably provides an interposer which may be juxtaposed between microelectronic elements for electrically interconnecting the microelectronic elements. The electrical and/or magnetic field generally alters the configuration of the particles to provide one or more substantially vertically-directed conductive paths through the layer of anisotropic conductive material. Each vertically-directed conductive path preferably includes a plurality of the electrically conductive particles which have been drawn into areas of high concentration by the application of the field. The programmed layer may be stored between one or more storage liners, such as thin flexible sheets of plastic. The storage liners protect the layer from contamination. A release treatment, such as TEFLON, may be disposed between the storage liners and the major surfaces of the layer of anisotropic conductive materials so that the storage liners may be easily removed from the layer prior to assembly with one or more microelectronic elements.

The layer prepared in accordance with the methods described above may also be used to electrically interconnect microelectronic elements. For example, a first microelectronic element such as a semiconductor chip having a plurality of contacts on a front surface thereof may be juxtaposed and abutted against the first major surface of the layer of anisotropic conductive material, with the contacts on the semiconductor chip preferably aligned with the vertically-directed conductive paths which have been programmed into the layer. A second microelectronic element such as a printed circuit board having a plurality of electrical contacts on the top surface thereof is then juxtaposed with and abutted against the second major face of the layer of anisotropic conductive material. The electrical contacts on the printed circuit board are preferably aligned with the contacts on the semiconductor chip and with the vertically directed conductive paths of the layer so that the contacts of the semiconductor chip are electrically interconnected with the contacts of the printed circuit board.

A layer of anisotropic conductive material is typically compressed in order to lower resistance and improve electrical conduction through the layer's conductive paths. The compression step may be performed before or, preferably, after the first and second microelectronic elements described above have been abutted against the respective first and second major faces of the layer. The first and second microelectronic elements are preferably moved toward one another so as to compress the layer in the vertical direction to lower the resistance of the vertically-directed conductive paths.

In other preferred embodiments of the present invention, a method of making a microelectronic package includes providing a microelectronic element having a plurality of electrical contacts on a first surface thereof, and then providing a layer of anisotropic material over the first surface of the microelectronic element. The layer includes a dielectric material in a fluid condition and electrically conductive particles in the dielectric material. A field, such as an electrical field or a magnetic field is then applied through the contacts on the first surface of the microelectronic element to the anisotropic conductive material so as to alter the configuration of the electrically conductive particles. In certain embodiments, during the applying a field step, the electrically conductive particles having elongated axes are turned so that the elongated axes are directed in a substantially vertical direction running between the first and second major faces of the layer of anisotropic conductive material. The application of the field may also move at least some of the electrically conductive particles in horizontal directions, the horizontal directions being substantially parallel to the major faces of the layer of anisotropic conductive material.

As a result, at least some of the electrically conductive particles move into areas which are in substantial alignment with the electrical contacts so as to form areas within the layer of high particle concentration interspersed with areas of low particle concentration. The vertically-oriented particles and/or areas of high particle concentration provide conductive paths which enable electrical signals to be transmitted therethrough. After the field has been applied to the layer, the dielectric material is preferably set or cured, such as by using heat, so that the dielectric material is in a non-fluid condition after the moving step. A second microelectronic element, having a plurality of electrical contacts, may be abutted against the second major face of the layer before or after the field applying step so that the contacts of the first and second microelectronic elements confront one another. The vertically-oriented particles and/or particles in the areas of high particle concentration provide an electrical path through the layer and electrically interconnect the contacts of the first and second microelectronic elements. If the second microelectronic element is provided before the field applying step, the field may be directed through the contacts at the second microelectronic element as well as the first element.

In certain embodiments, a substrate such as a flexible dielectric sheet is provided over at least one of the oppositely-directed first and second major faces of the layer of a material incorporating a curable dielectric material. The flexible dielectric sheet preferably includes a polymeric material.

In an additional aspect of the present invention, a layer of an anisotropic conductive material includes a pair of oppositely-directed major faces, a vertical direction extending between the major faces, and horizontal directions transverse to the vertical direction. The layer of anisotropic conductive material includes a dielectric material and a plurality of conductive particles in the dielectric material whereby the conductive particles may be distributed non-uniformly in the horizontal directions so as to provide areas of high particle concentration interspersed with areas of low particle concentration. Alternatively or additionally, at least some of the conductive particles may be elongated, and at least some of the elongated particles may have their axes of elongation disposed in substantially the vertical direction. The particles generally abut one another so as to provide low-resistance electrical paths between the major faces. The resistance of the electrical paths may be further reduced by compressing the layer so as to more closely array the conductive particles concentrated in the high particle concentration areas. The conductive layer may be placed in storage by applying storage liners over the respective first and second major surfaces of the layer. The storage liners protect the layer from contamination while in storage. The storage liners are preferably removed so that the layer may be assembled between microelectronic elements. The vertically-oriented conductive particles and/or the conductive particles in the areas of high particle concentration provide a series of substantially vertical paths through the layer so that separate and distinct electrical signals may be transmitted through the layer, with each distinct signal being electrically isolated from neighboring signals.

These and other objects, features and advantages of the present invention will be more readily apparent from the detailed description of preferred embodiments as set forth below and when taken in conjunction with the accompanying drawings.

DETAILED DESCRIPTION OF THE PREFERRED EMBODIMENTS

Figure 1A:
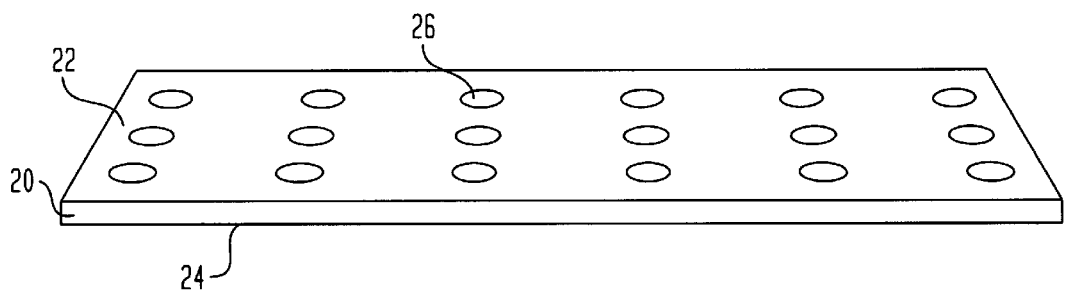
FIG. 1A shows a perspective view of a substrate used to make an anisotropic conductive element according to one preferred embodiment of the present invention.
Figure 1B:
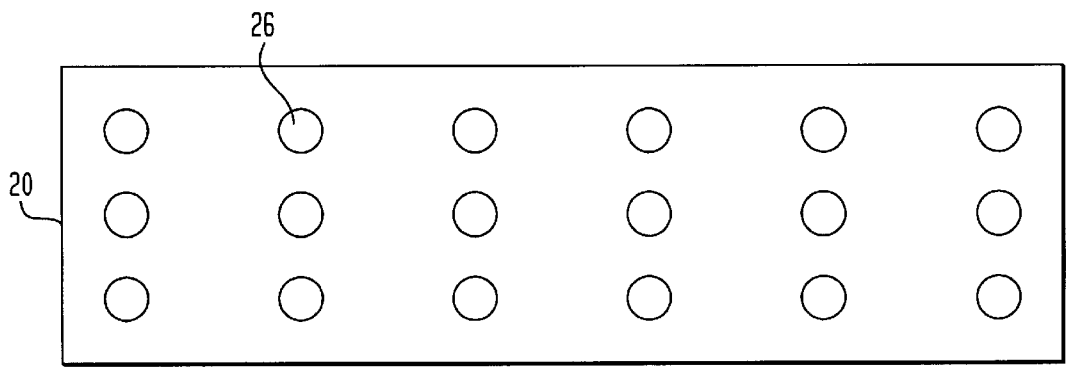
FIG. 1B shows a top view of the substrate shown in FIG. 1A.

One preferred embodiment of the present invention provides a method of making an anisotropic conductive element which is used in making a microelectronic package. Referring to FIG. 1A, a substrate 20 includes a dielectric material and has a first surface 22 and a second surface 24 with a plurality of electrical contacts 26 extending from the first surface 22 to the second surface 24 and lying on a standard contact pitch. As used herein the term "contact pitch" is defined as being the center to center distance between adjacent contacts on a microelectronic element. FIG. 1B depicts a top view of the substrate 20 shown in FIG. 1A, whereby the plurality of contacts 26 are disposed uniformly throughout the substrate in a matrix or area array configuration.

Figure 2:
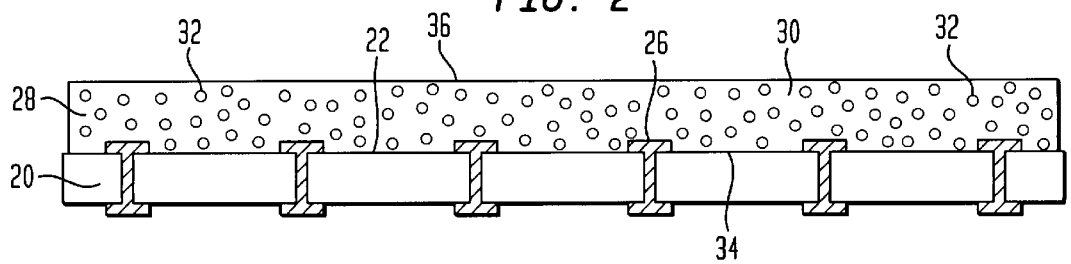
FIG. 2 shows a cross-sectional side view of the substrate shown in FIG. 1A including a layer of anisotropic conductive material having a plurality of conductive particles during further stages of a method of making an anisotropic conductive element according to one preferred embodiment of the present invention.

Referring to FIG. 2, a layer of an anisotropic conductive material 28 is provided over the first surface 22 of the substrate 20 so as to cover portions of the contacts 26 accessible at the first surface 22 thereof. The layer of anisotropic conductive material 28 preferably includes a dielectric material 30, such as polymeric compound or a silicone elastomer. The dielectric material 30 includes a plurality of electrically conductive particles 32 which are typically uniformly spaced throughout the layer 28. The dielectric material 30 is preferably provided in a fluid or uncured condition so that the plurality of electrically conductive particles 32 are able to move in horizontal and vertical directions during later processing steps. The layer of anisotropic conductive material 28 preferably has a thickness of between about 100–200 microns and the electrically conductive particles 32 preferably have a diameter of approximately 5–20 microns. However, the thickness of the layer 28 and the diameter of the particles 32 may vary depending upon the specific composition of the materials utilized. In general, the thickness of the layer of anisotropic conductive material 28 is about 5–10X the diameter of the electrically conductive particles 32.

The layer of anisotropic conductive material 28 preferably has a pair of oppositely directed major faces including a first major face 34 which is in contact with the first surface 22 of the substrate 20 and a second major face 36 which is remote therefrom. The layer 28 defines a vertical direction which is generally perpendicular to and which extends between the first and second major faces 34 and 36 and horizontal directions which extend parallel to the first and second major faces 34 and 36. The terms "vertical" and "horizontal" are used herein to indicate directions relative to the layer of anisotropic conductive material and the elements to which it is assembled. It should be understood that these terms are used to refer to the frame of reference of the layer itself, and not to the ordinary, gravitational frame of reference. Likewise, the terms "top" and "bottom" should also be understood as referring to the frame of reference of the layer and/or the elements assembled thereto.

In certain embodiments, the layer of anisotropic material may include an adhesive so that the layer may be effectively assembled to another element, such as a microelectronic element, while applying a minimal amount of heat and pressure to the layer and the element. For example, the dielectric material may be an uncured or partially-cured adhesive composition. One suitable adhesive composition includes a thermosetting adhesive, frequently referred to as a "snap-cure" adhesive. Generally, such an adhesive is initially provided in a first solid, non-tacky state and momentarily transforms into a fluid state upon being heated above a pre-set activation temperature. After further heating, the adhesive transforms back into a second solid state. One suitable solvent-free "snap-cure" adhesive is sold by Toshiba.

Figure 3A:
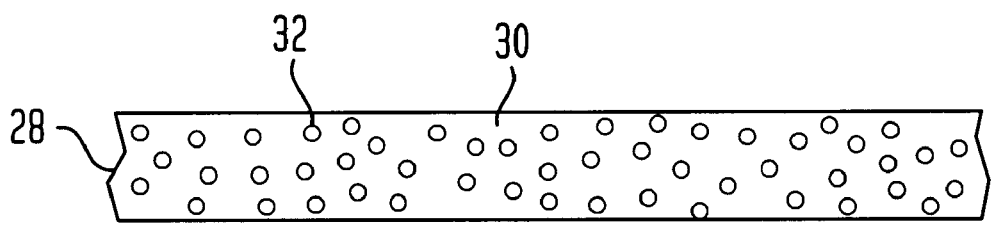
FIG. 3A shows a layer of anisotropic conductive material.
Figure 3B:
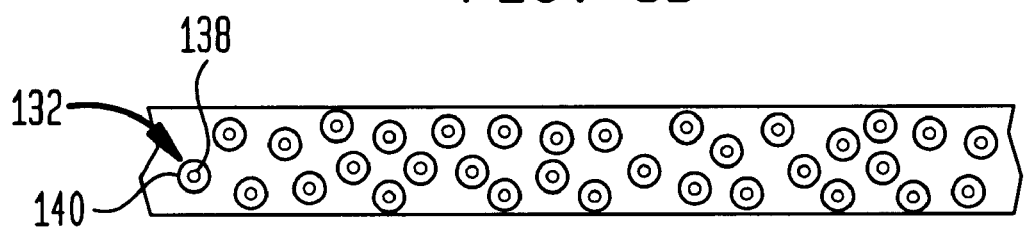
FIG. 3B shows a layer of anisotropic conductive material according to another embodiment of the present invention.
Figure 3C:
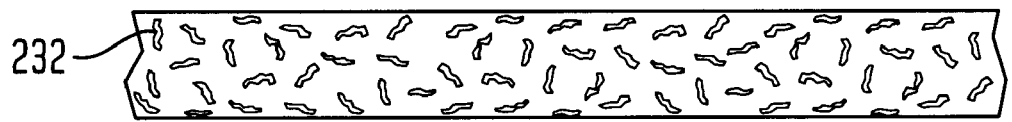
FIG. 3C shows a layer of anisotropic conductive material according to yet another embodiment of the present invention.

FIGS. 3A–3C show various preferred embodiments of the layer 28 having a plurality of electrically conductive particles 32 spaced uniformly throughout the dielectric material. FIG. 3A shows a first preferred embodiment in which the electrically conductive particles 32 include solid metal balls, such as copper balls. FIG. 3B shows a second preferred embodiment in which the particles 132 include a central core 138 coated with an outer layer 140 of an electrically conductive material. The central core 138 may be either conductive or non-conductive, solid or hollow, and typically includes materials such as epoxy or other polymers, glass and/or silicone. FIG. 3C shows yet another preferred embodiment of the conductive particles 232 in which the particles include elongated metallic filings, such as iron filings or silver flakes, having lengthwise axes, also referred to as axes of elongation. Typical round particles in between about 2 to about 20 microns in diameter whereas typical elongated particles are about 2 to about 20 microns long.

Figure 4:
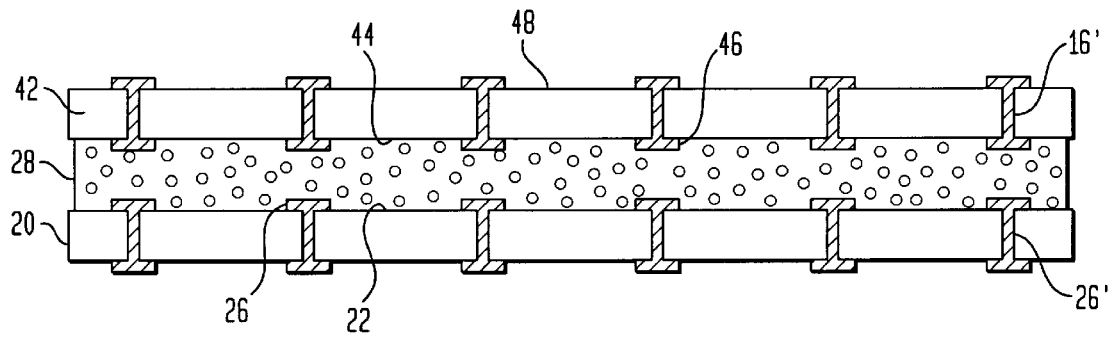
FIG. 4 shows a cross-sectional side view of the layer shown in FIG. 2 during further stages of a method of making an anisotropic conductive element.

Referring to FIG. 4, after the layer of anisotropic conductive material 28 has been provided over the first surface 22 of the substrate 20, a second substrate 42 is juxtaposed with the first substrate 20 and the layer of anisotropic conductive material 28 so that a first interior surface 44 of the second substrate 42 abuts against the layer of anisotropic conductive material 28. In this embodiment, the second substrate 42 is similar to the first substrate 20 and includes a plurality of electrical contacts 46 extending from the first surface 44 to a second surface 48 thereof remote from the first substrate 20. After the second substrate 42 is abutted against the layer of anisotropic conductive material, the contacts 46 on the second substrate 42 are preferably in substantial alignment with the contacts 26 on the first substrate 20.

Figure 5:
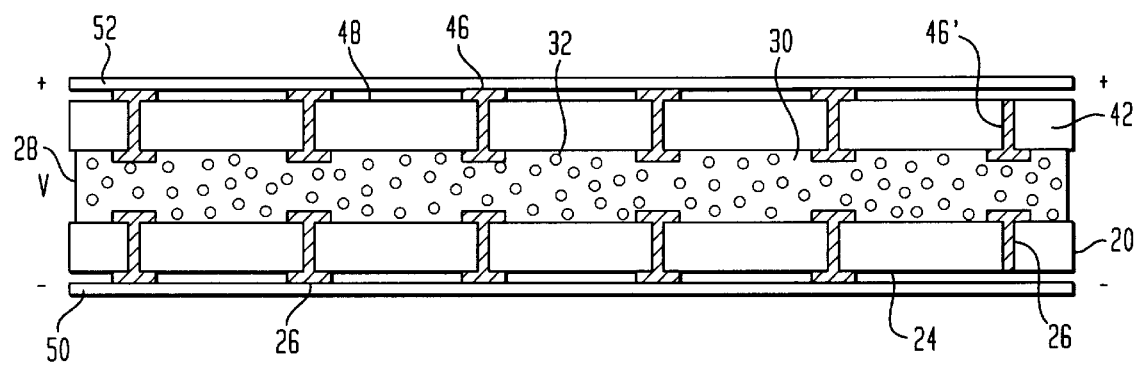
FIG. 5 is a view similar to FIG. 4 but showing further stages of a method of making an anisotropic conductive element.

Referring to FIG. 5, a first electrically conductive plate 50 is provided over the second surface 24 of the first substrate 20. The first conductive plate 50 preferably engages one or more of the contacts 26 accessible at the second surface 24 of the first substrate 20. A second electrically conductive plate 52 is also provided over the second surface 48 of the second substrate 42 and one or more of the contacts 46 accessible at the second surface 48. An electrical field is then applied to the first and second electrically conductive plates 50 and 52 so that the plates impart different potentials. The field is thus applied to the layer of anisotropic conductive material 28 through the contacts 46 and 26 engaging the respective conductive plates 52 and 50 so as to alter the configuration of the conductive particles 32 within the dielectric material 30. Although a wide range of field strengths may be employed, a difference in potential between plates 50 and 52 typically is 10–200 volts and more typically 1–100 volts. The field is preferably applied for approximately 2–5 minutes. When applying the field, the temperature of the dielectric material should be maintained below the curing temperature of the dielectric material. This is particularly true for materials which cure rapidly. However, in certain embodiments the steps of applying heat and applying a field may occur simultaneously. At this particular stage of the process, it is critical that the dielectric material 30 remain fluid so that the conductive particles 30 are free to move in response to forces generated by the electrical field. Upon activation of the field, the conductive particles 32 generally move and congregate between the aligned contacts 26 and 46 on the opposing substrates 20 and 42. The movement of the conductive particles 32 creates, within the layer 28, areas having a high concentration of conductive particles interspersed with areas having a relatively low concentration of conductive particles. The areas of the layer 28 having a high concentration of conductive particles are preferably located between the contacts 26 and 46 for conducting electrical signals through the layer 28 from the first major surface 34 to the second major surface 36 thereof.

Figure 6A:
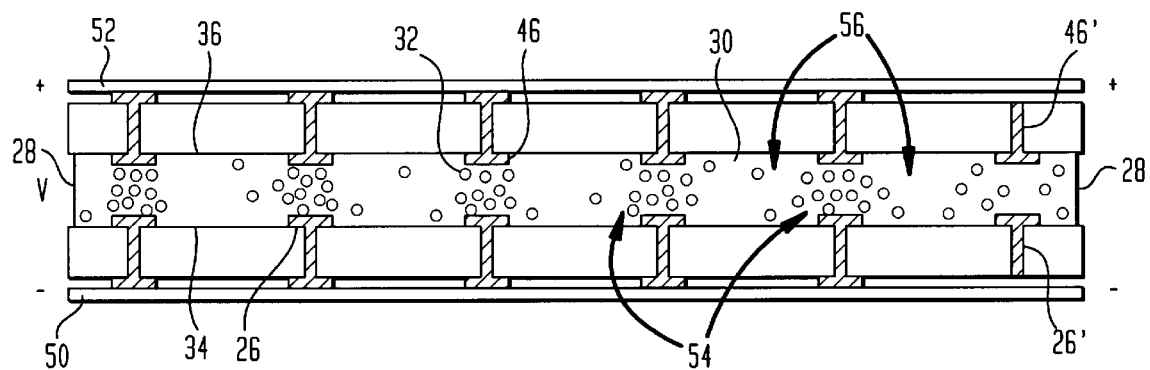
FIG. 6A is a view similar to FIG. 5 but showing yet further stages of a method of making an anisotropic conductive element.
Figure 6B:
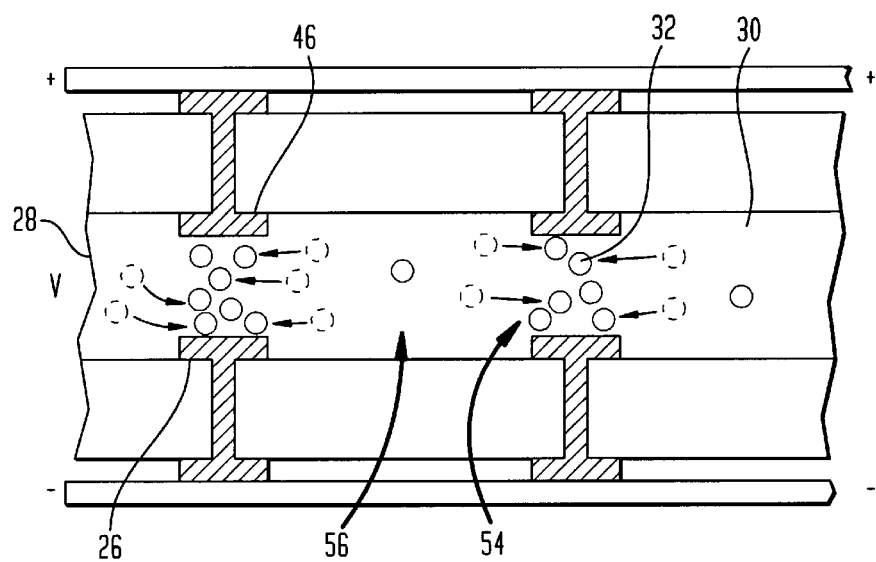
FIG. 6B is a fragmentary cross-sectional view of the assembly shown in FIG. 6A on an enlarged scale.
Figure 7:
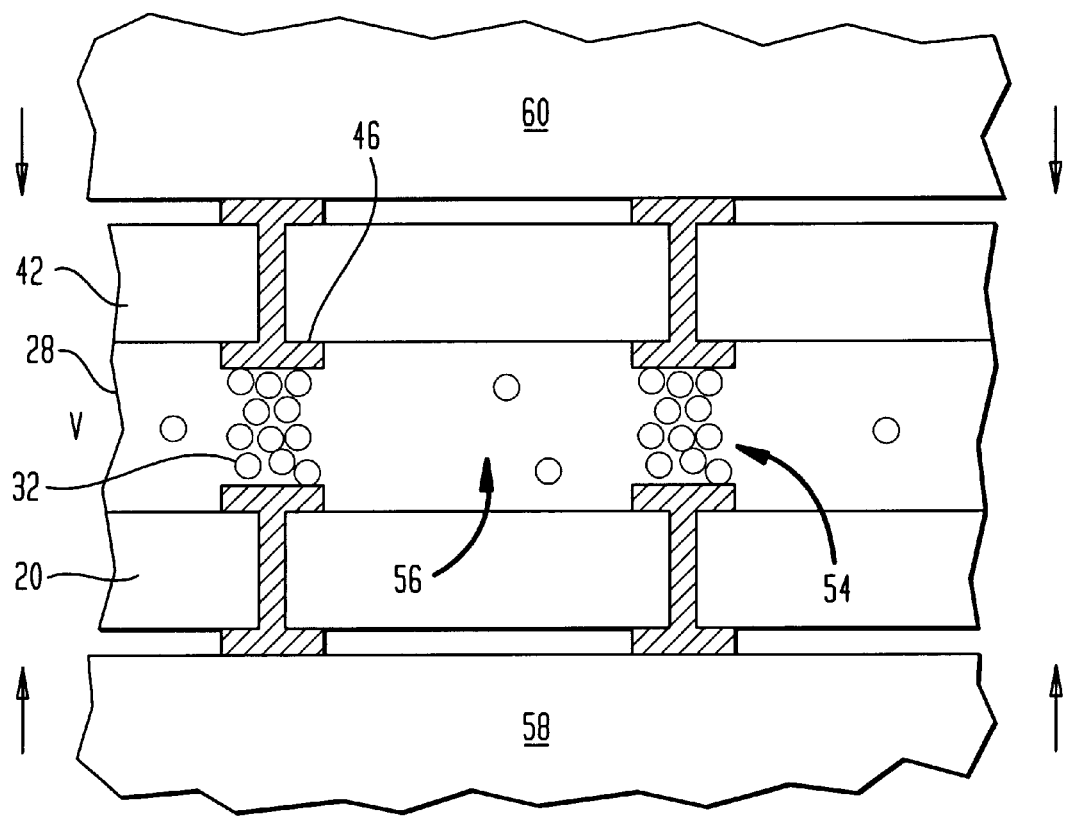
FIG. 7 is a view similar to FIG. 6A during a further stage of a method of making an anisotropic conductive element.

FIGS. 6A and 6B show identical side views of the conductive particles 32 moving and congregating between the contacts 26 and 46 when an electrical field is generated by the first and second electrically conductive plates 50 and 52. The electrical field creates an electrical dipole between each pair of aligned contacts 26 and 46. Although the present invention is not limited by any theory of operation, it is believed that non-uniformity in the electric field in different regions of layer 28 causes horizontal movement of particles in the layers. Regardless of the theory of operation, however, the particles tend to congregate in regions between the contacts. The conductive particles 32 move horizontally through the dielectric material 30. The FIG. 6A embodiment shows six pairs of aligned contacts, however, it is contemplated a package could have more or less contacts. After the field has been applied, the layer of anisotropic conductive material 28 includes areas of high particle concentration 54 which are interspersed with areas of low particle concentration 56. The areas of high particle concentration 54 form conductive paths which generally extend in the vertical direction between the major faces 34 and 36 of the layer 28. FIG. 6B depicts a close-up side view of FIG. 6A and shows movement of the electrically conductive particles 32 when the electrical field is applied to the electrically charged plates 50 and 52.

The electrical or magnetic field may be applied to only certain areas of the layer 28. For example, as shown in FIGS. 4, 5 and 6A, one opposed pair of aligned contacts, designated by reference numerals 46' and 26', are not in engagement with respective electrically conductive plates 52 and 50. As a result, the strength of the field in that area of the layer is relatively weak. As such, the configuration of the conductive particles in the vicinity of contacts 46' and 26' is not altered by application of the field.

After the steps described above, the vertically arrayed conductive paths still have relatively high resistance because the individual conductive particles 32 generally remain separated from one another by the dielectric material 30. For example, in FIG. 6B it is shown that dielectric material 30 is present between most, if not all, of the conductive particles 30 congregated between the contacts 26 and 46. Thus, the potential applied through the contacts does not cause a large current to flow through the layer during the potential-applying step. In order to improve the conductivity and provide lower-resistance electrical paths between the contacts 26 and 46, the layer 28 is preferably compressed after the electrical potential has been removed so that the conductive particles in the areas of high concentration 54 are placed in intimate contact with one another. This may be accomplished by providing platens 58 and 60 over the respective substrates 20 and 42 and moving the platens 58 and 60 toward each other to compress the layer of conductive material 28. The pressure applied by the platens is preferably between about 100–400 kg/cm$^2$. As a result, the conductive particles 32 in each vertically-directed conductive path are brought closer together, thus improving the electrical conductivity of the paths and lowering the resistance through the layer 28.

The final assembly includes a layer of anisotropic conductive material 28 having areas of high particle concentration 54 interspersed between areas of relatively low particle concentration 56. As such, each conductive path extending through the areas of high particle concentration 54 is electrically isolated from neighboring conductive paths by areas of low particle concentration 56. The conductive layer may be used for fine pitched assemblies where it is necessary to have a large number of highly conductive paths interconnected with closely spaced contacts.

Figure 8A:
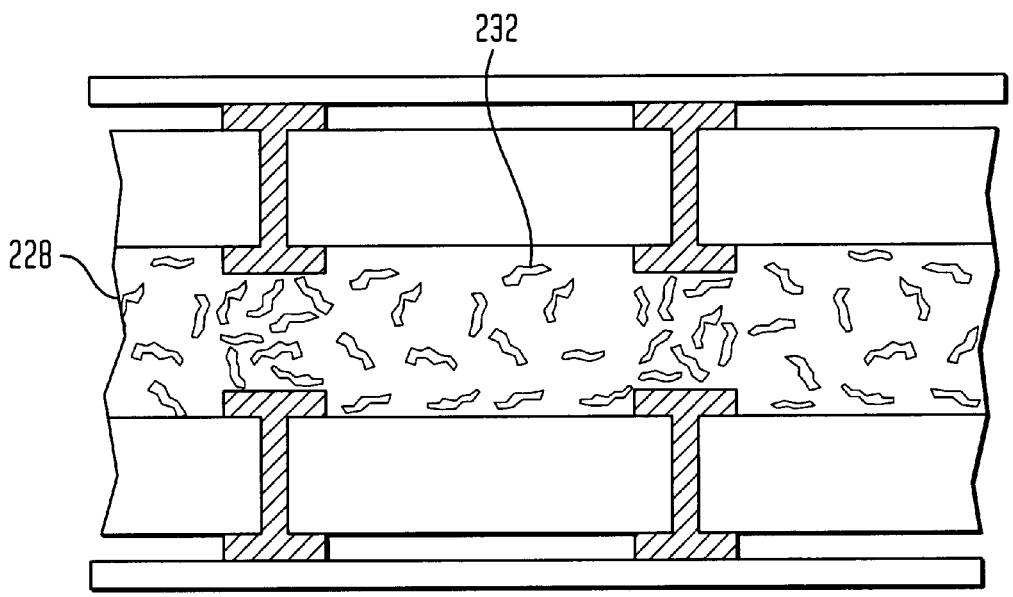
FIGS. 8A, 8B and 9 are views similar to FIG. 6A but showing a method of making an anisotropic conductive element according to another preferred embodiment of the present invention.
Figure 8B:
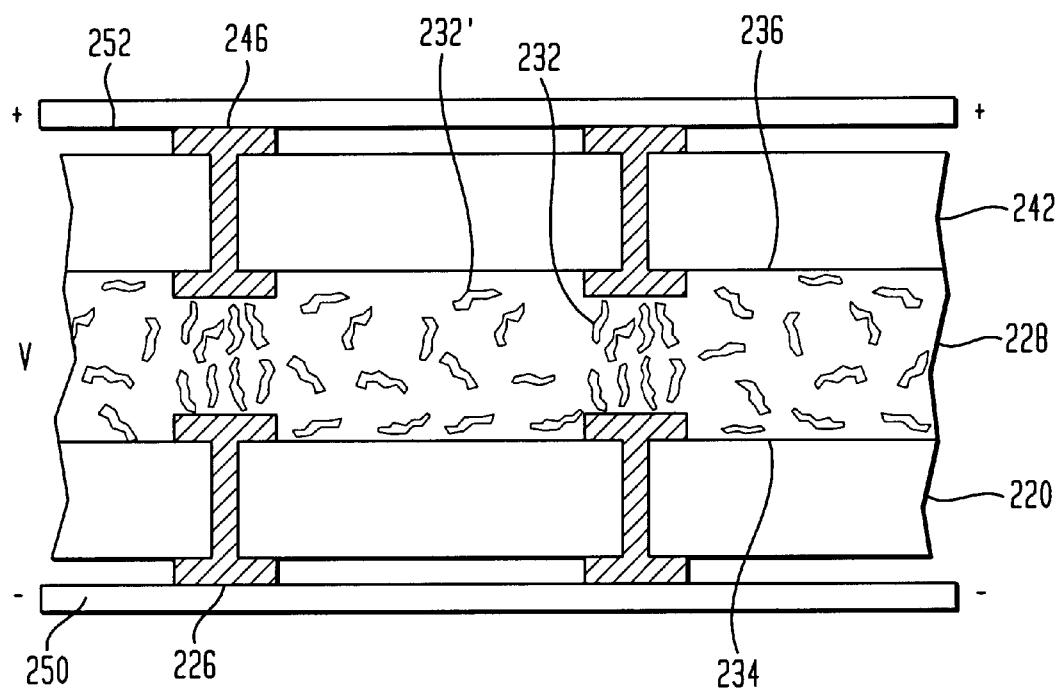
Figure 9:
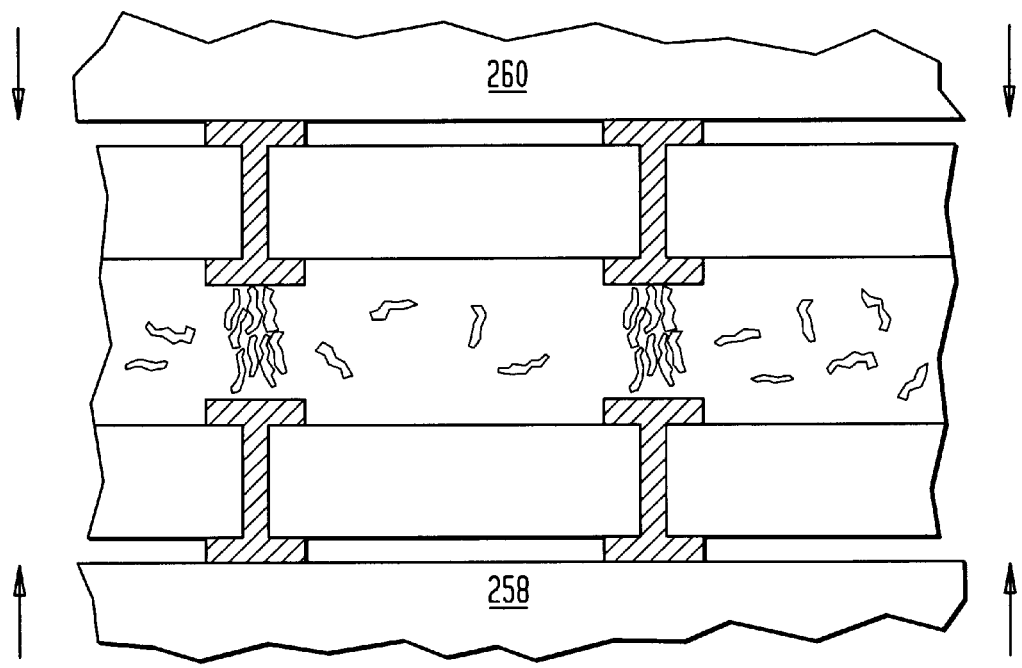

FIGS. 8A–8C show another embodiment of the present invention wherein the layer of anisotropic conductive material 228 includes a plurality of conductive particles 232, such as metallic filings, which are elongated. Referring to FIG. 8A, each iron has a longitudinal or elongated axis. Referring to FIG. 8B, an electrical field may be applied to the layer 228, such as by using the electrically conductive plates and method described above. In the FIG. 8B embodiment, an electrical field is then applied to the first and second electrically conductive plates 250 and 252 so that the plates impart different potentials, thereby generating an electrical field which is applied to the layer 228. The application of the electrical field causes at least some of the elongated particles 232 to turn their axes of elongation toward the vertical direction (i.e. so that the ends of each particle point toward the major faces 234 and 236 of the layer 228) to provide vertically directed electrical paths through at least some of the elongated particles 232. Although the present invention is not limited by any theory of operation, it is believed that this action arises from electrical dipoles which are impressed on the particles. Thus, if one end of a particle initially lies slightly closer to the positive potential on contact 246, that end will become negatively charged whereas the opposite end will be positively charged. The negatively charged end will be pulled toward the positive contact 246, whereas the positively charged end will be pulled toward the negative contact 226. As shown in FIG. 8B, the elongated conductive particles 232 located substantially within the area between the pairs of aligned contacts 226 and 246 are turned to the greatest extent by the electrical field. The conductive particles (designated 232') to the sides of the contacts 226 and 246 need not turn substantially, and normally do not do so. This is believed to be because an electrical dipole of sufficient strength is not generated in those particular particles. Referring to FIG. 9, in order to improve electrical conduction between the conductive particles which have turned in response to the electrical field, platens 258 and 260 are used to compress the layer 228, whereby conductive particles 232 are moved closer together to provide lower resistance electrical paths through the layer 228.

Figure 10:
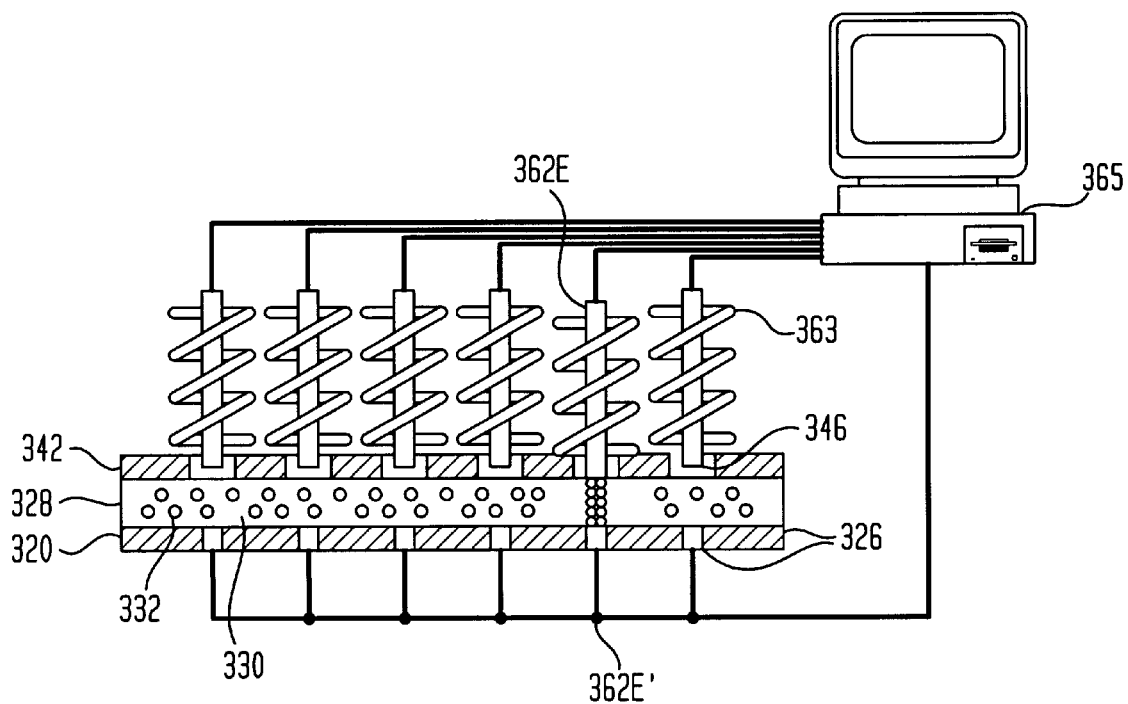
FIGS. 10–13 are further diagrammatic sectional views showing a method of making an anisotropic conductive element according to yet another embodiment of the present invention.
Figure 11:
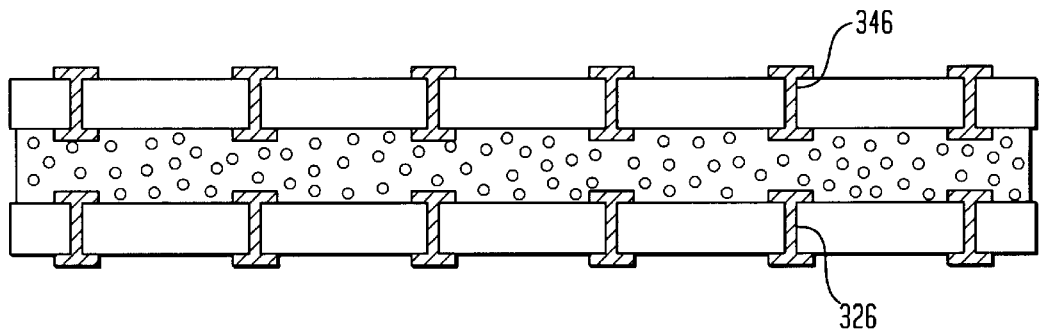
Figure 12:
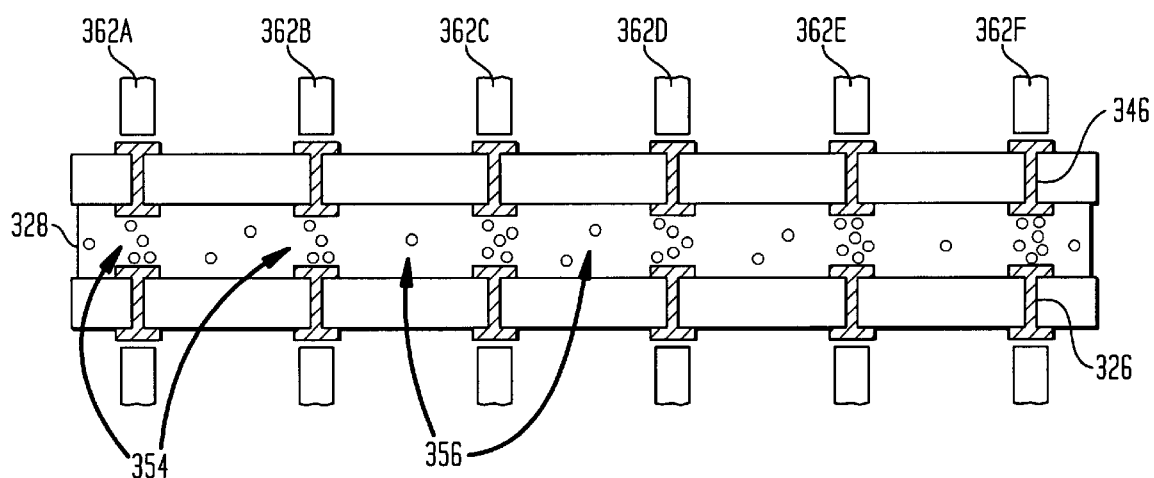
Figure 13:
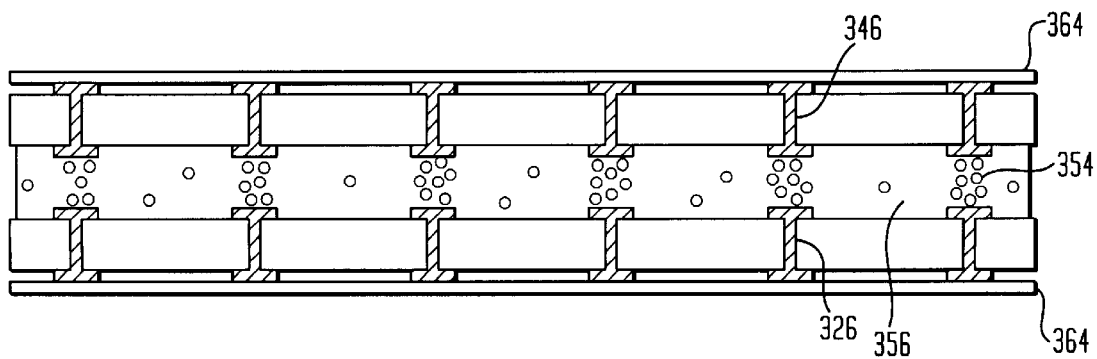

FIGS. 10–13 show further methods of making anisotropic conductive elements whereby the conductive paths are generated through the layer of anisotropic conductive material using a magnetic field to move the conductive particles within the layer. Referring to FIG. 10, a microelectronic assembly substantially similar to that shown and described in FIGS. 1–4 is provided. The assembly includes a layer of anisotropic conductive material 328 provided between first and second substrates 320 and 342. The substrates 320 and 342 have internal surfaces which confront one another. Each substrate 320 and 342 also includes a plurality of contacts 346, 326 which are aligned with and oppose one another. The particular assembly shown in FIG. 10 includes six pairs of opposed contacts, whereby the contacts 326 and 346 of each pair confront one another. The layer of anisotropic conductive material 328 includes a plurality of electrically conductive particles 332 which are dispersed throughout the dielectric material 330. The electrically conductive particles in this embodiment desirably include ferromagnetic materials such as iron, nickel, or the like or alloys of such materials. The dielectric material 330 is initially provided in a fluid or uncured condition so that the conductive particles 332 can move freely throughout the dielectric material 330 in response to the application of an electrical or magnetic field to the layer 328. As shown in FIG. 10, the assembly is placed in contact with a programming system which applies a magnetic field to the layer to form a series of vertically-directed conductive paths through the layer. The programming system preferably includes paired magnetic elements which selectively provides a North magnetic polarity to one of the contacts 346 on the second substrate 342 while applying a South magnetic polarity to contacts 326 on the opposite substrate aligned therewith. The paired magnetic elements are provided with individual solenoids 363. Solenoids 363 are linked to a computer control system 365. The control system can selectively activate each solenoid 363 so as to apply a magnetic flux through each element 362. As best seen in FIG. 12, elements 362 are engaged in alignment with contacts 346 and 326 on the substrates. For example, as shown in FIG. 10, when magnetic element 362E is supplied with a North magnetic polarity and magnetic element 362E' is provided with a South magnetic charge, a magnetic dipole is formed so that the conductive particles 332 move laterally and congregate between the aligned contacts 326 and 346. Referring to FIG. 12, the paired magnetic elements 362A–362F are systematically activated so as to program the layer of material 328 whereby the conductive particles 332 concentrate in areas of high particle concentration 354 which extend in vertical directions between the first and second major surfaces 334 and 336 (not shown) of the layer 328 and areas of low particle concentration 356 interspersed between the areas of high particle concentration 354. By selectively activating particular elements 362, the computer system can provide any desired pattern of areas of high particle concentration. As shown in FIG. 13, after the layer 328 has been programmed, flexible storage liners 364, such as thin plastic sheets, may be provided over the exterior surfaces of the assembly to protect the contacts 326 and 346 from contamination during storage. A release treatment such as TEFLON (not shown) may be provided between the storage liners 364 and the contacts 326 and 346 so the storage liners may be easily removed from the assembly when the assembly is connected to other circuit elements, such as printed circuit boards.

Figure 14:
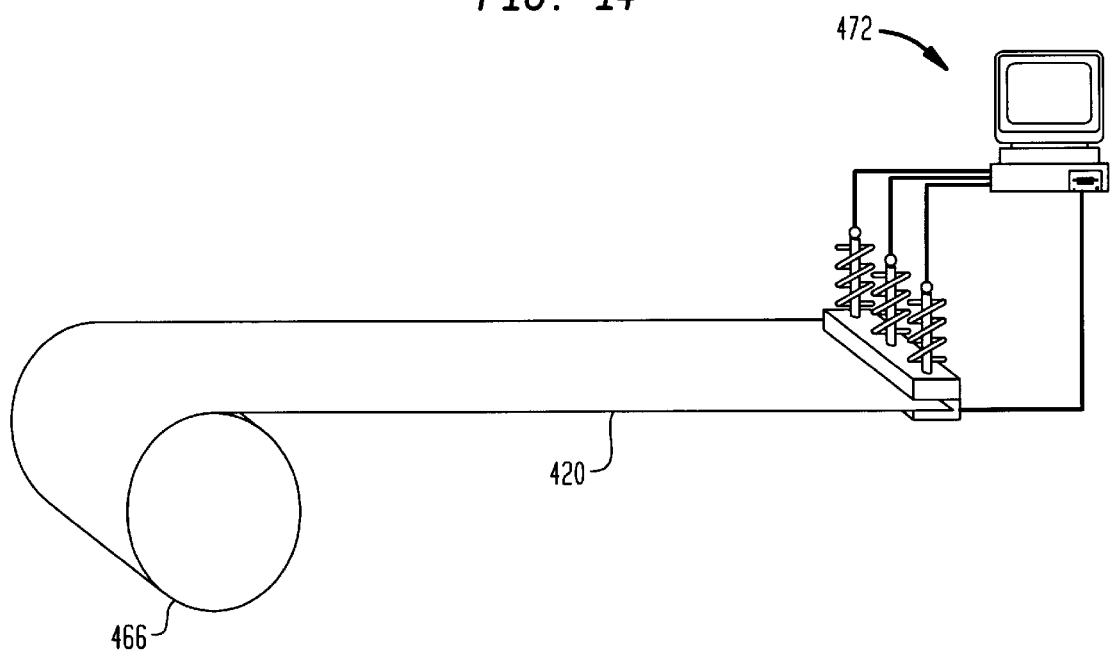
FIGS. 14–16 are further diagrammatic sectional views showing a method of making an anisotropic conductive element according to still further embodiments of the present invention.
Figure 15:
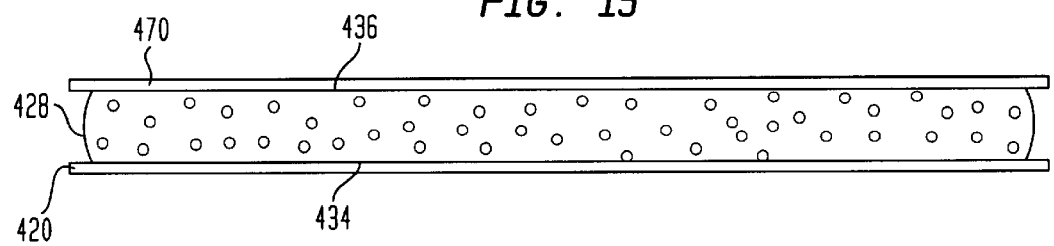
Figure 16:
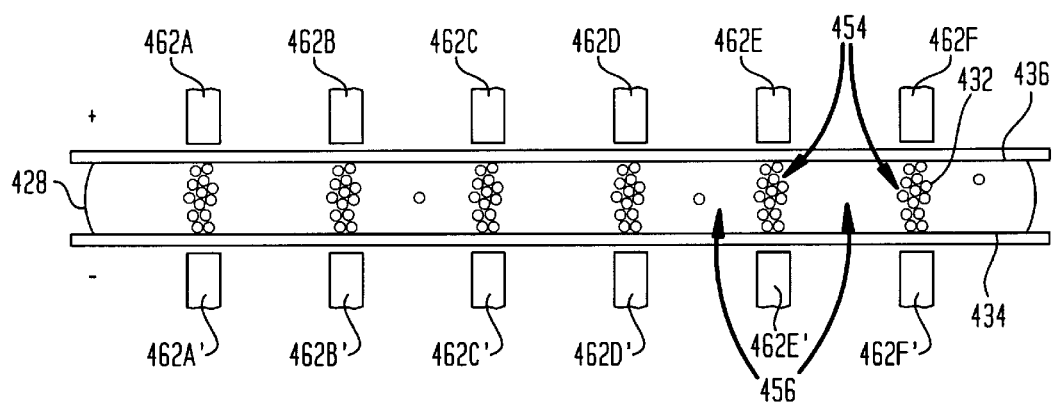

FIGS. 14–16 show another embodiment of the present invention including methods for making anisotropic conductive elements whereby the conductive elements are fabricated while remaining on a continuous roll 466 of flexible, dielectric tape. Referring to FIG. 15, a continuous roll of a substrate 420, such as a flexible dielectric film, has a layer of anisotropic conductive material 428 which are provided along the length thereof. The layer of anisotropic conductive material 428 has a first surface 434 which engages a top surface 422 of the dielectric film 420 and a second surface 436 remote therefrom. The second surface 436 of the layer 428 preferably has a storage liner 470 provided thereon for protecting the layer 428 from contamination. As shown in FIG. 14, the roll 466 of dielectric film 420 is systematically moved downstream along an assembly line so that successive regions of the layer of anisotropic conductive material 428 may be programmed using a programming tool 472, such as the programming system described above in FIG. 10. In order to program one of the regions, the dielectric film 420 is advanced so that paired magnetic elements 462 are juxtaposed with opposing surfaces of the region. As shown in FIG. 16, a first set of magnetic elements 462A–462F, which provide a North magnetic polarity, overlie the top surface 436 of the layer of anisotropic conductive material 428, and are paired with a second set of magnetic elements 462A'–462F', which provide a South magnetic polarity and which underlie the bottom surface 434 of the layer 428. Each opposed pair of magnetic elements are preferably provided in substantial alignment with one another.

The programming tool 472 may be controlled by a computer system including a processing unit and a software program. The programming tool is activated so as to systematically activate the six sets of paired magnetic elements 462A–462F whereby the conductive particles 432 underlying and adjacent the aligned magnetic elements are attracted to a position in which they form a substantially vertically-directed conductive path between the first and second major surfaces 434 and 436 of the layer. The layer 428 is then indexed or moved in a downstream direction relative to tool 472, and the process is repeated until the layer 428 is completely programmed to provide a series of vertically arrayed conductive paths through the layer (i.e. areas of high particle concentration 454) interspersed with areas which are non-conductive (i.e. areas of low particle concentration 456). The programmed layer of anisotropic conductive material 428 may remain on the reel of substrate 420 while in storage or the flexible tape 420 may be severed so that a part of the layer may be stored separately from other parts of the layer.

Figure 17:
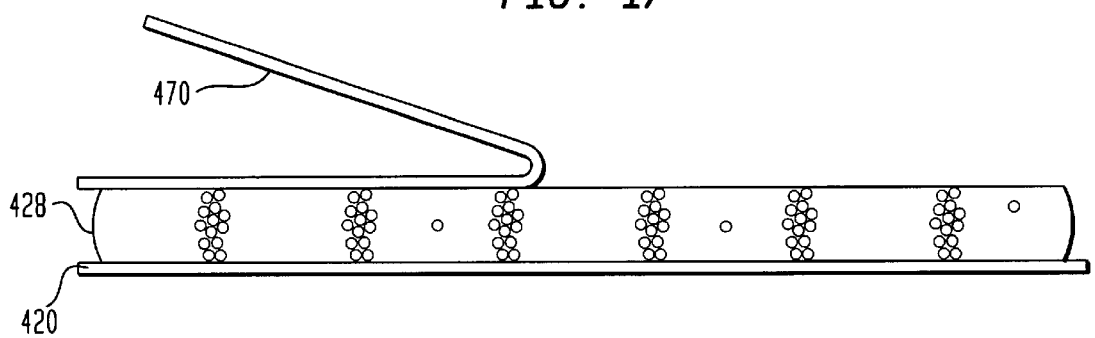
FIGS. 17–20 are further diagrammatic sectional views showing a method of assembling the anisotropic conductive element of FIG. 16 between two microelectronic elements, according to still further embodiments of the present invention.
Figure 18:
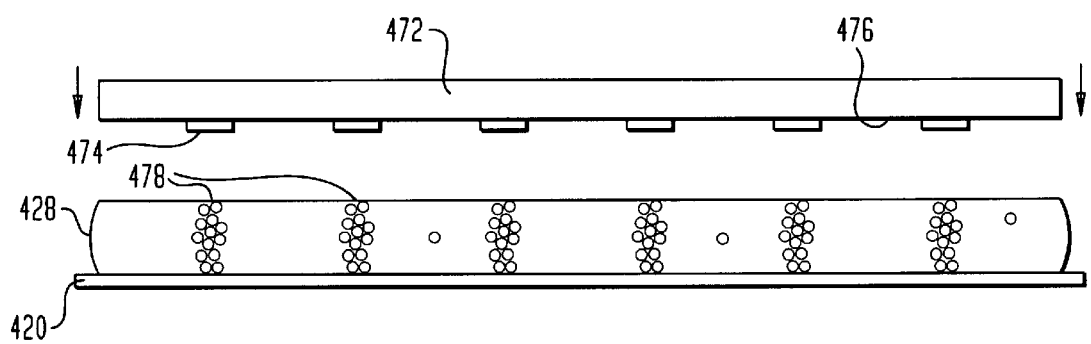

Referring to FIGS. 17 and 18, when it is desirable to assemble the part of the layer of anisotropic conductive material 428 with microelectronic elements, the subassembly of layers 428, 420 and 470 is juxtaposed with a microelectronic element, such as a semiconductor chip 472 having a plurality of contacts 474 on a front face 476 thereof. The top storage liner 470 is then removed, preferably by pulling the storage liner 470 at an acute angle, and the second surface 436 of the layer 428 is abutted against the front face 476 of the chip 472 so as to electrically interconnect the chip contacts 474 and the vertically-directed conductive paths 478 accessible at the top surface 436 of the layer 428. In the juxtaposing step, the areas of high particle concentration 454 are aligned with the contacts 474 on the microelectronic element.

Figure 19:
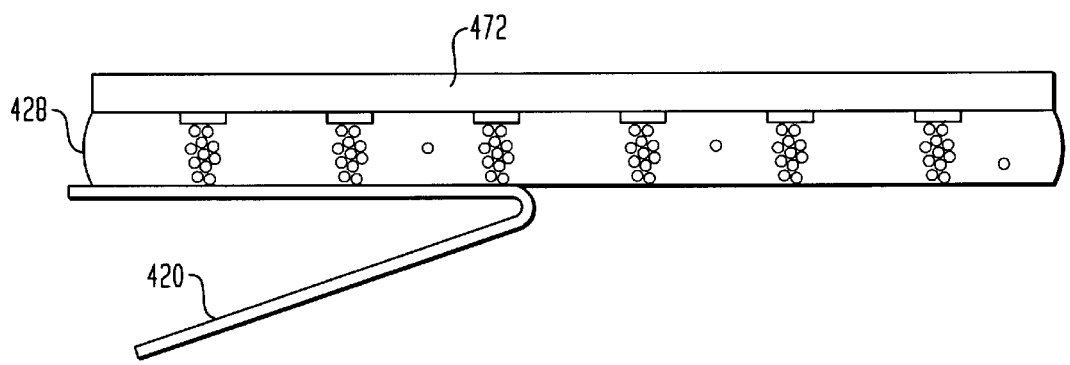
Figure 20:
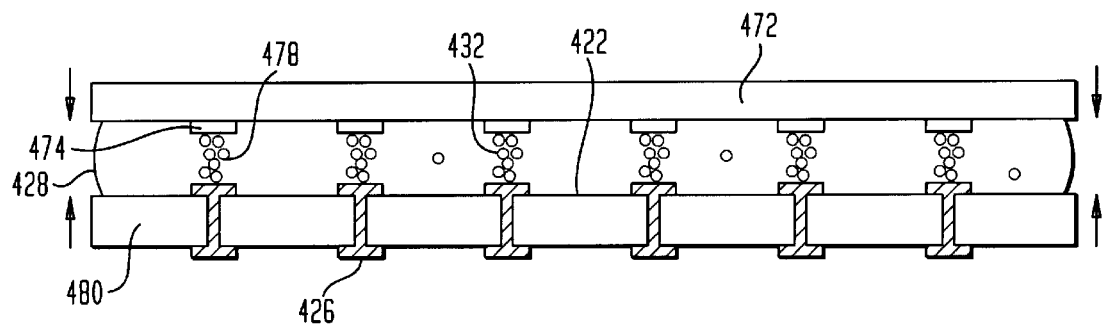

Referring to FIGS. 19 and 20, after the layer 428 is assembled to the chip 472, the dielectric film 420 is removed to expose the bottom surface 434 of the layer 428. A second microelectronic element 480, such as a substrate including a plurality of contacts 426 accessible at a top surface 422 thereof, is then assembled to the bottom 434 of the layer 428. The plurality of contacts 426 on the second microelectronic element 480 are preferably aligned with the chip contacts 474 and the vertically-directed conductive paths 478 programmed within the layer of anisotropic conductive material 428. The chip 472 and the substrate 480 are then pressed together so as to compress the layer 428. Compressing the layer 428 moves the vertically arrayed conductive particles 432 into closer contact with one another, thereby providing low-resistance conductive paths through the layer 428.

Figure 21:
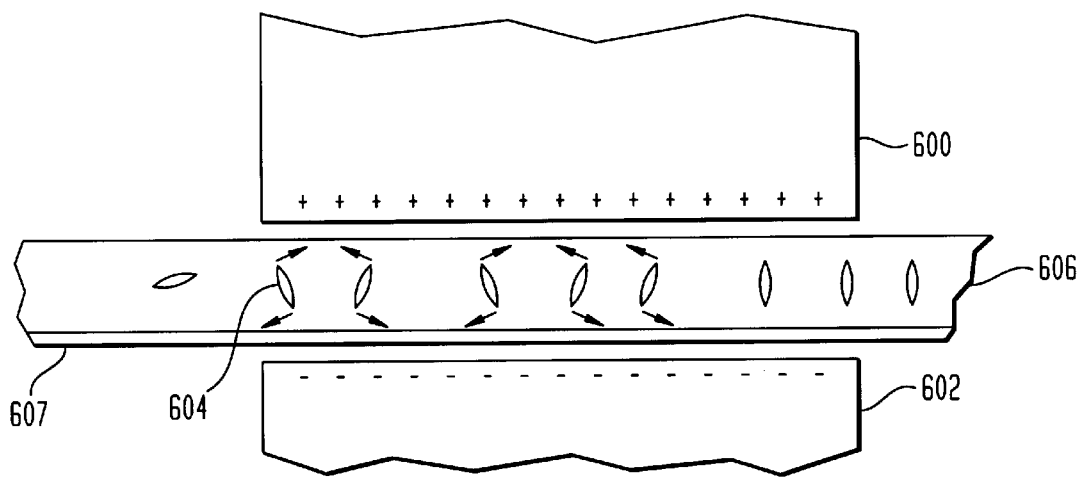
FIG. 21 shows a method of making an anisotropic conductive element according to yet another embodiment of the present invention.

In the embodiments discussed above, the field is applied non-uniformly across the horizontal dimensions of the layer, so as to provide regions of high field and regions of low field. However, the field may be applied uniformly over the horizontal extent of the layer. As shown in FIG. 21, a uniform electric field between pair of opposed plates 600 and 602 will tend to orient elongated conductive particles 604 in a layer 606 of dielectric material to generally vertical disposition. Although the particles will not move appreciable in horizontal directions, the particle orientation will tend to promote electrical conductivity in the vertical or through-layer direction and will tend to suppress conductivity in the horizontal directions. As also shown in FIG. 21, the field can be applied without physically contacting the layer as, for example, while layer 606 moves through the gap between plates 600 and 602 in a continuous motion on a dielectric belt or layer 607. A similar particle orienting effect can be achieved using elongated ferromagnetic particles and a uniform or substantially uniform magnetic field applied between plates 600 and 602, with vertically-directed magnetic flux.

Figure 22:
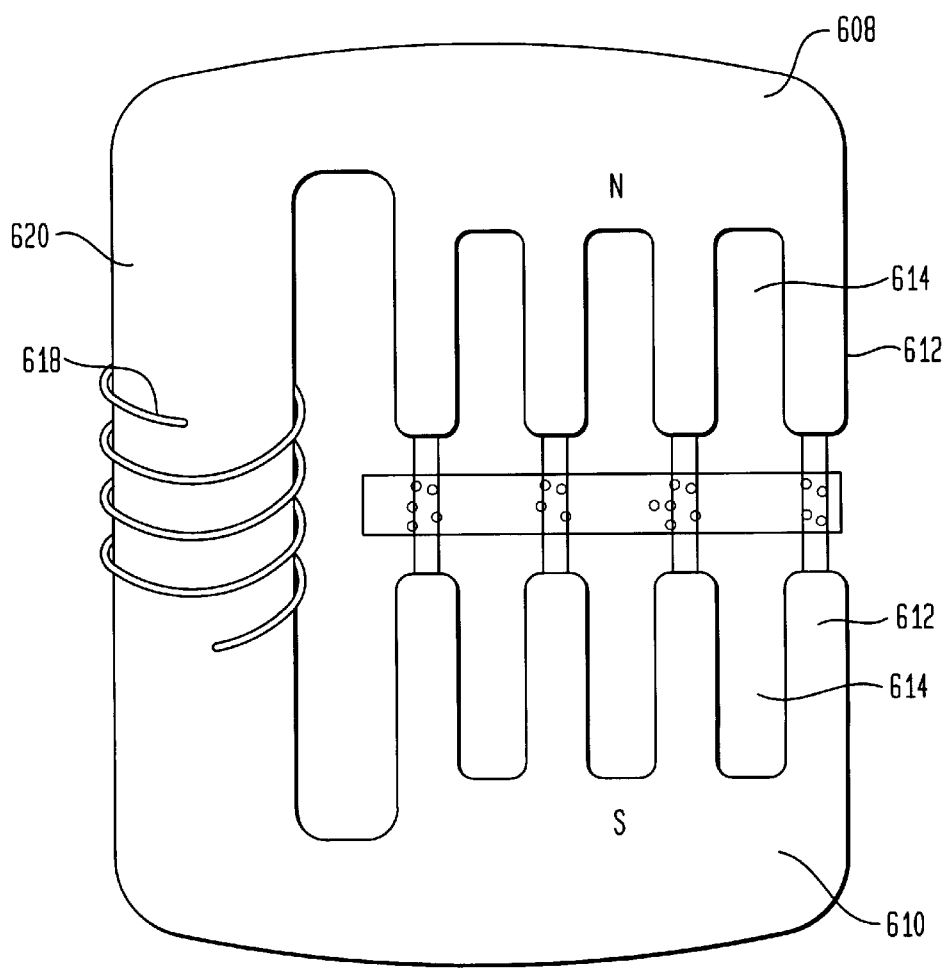
FIG. 22 shows a method of making an anisotropic conductive element according to another embodiment of the present invention.

In a further variant, shown in FIG. 22, a non-uniform magnetic field of a predetermined configuration can be applied using a pair of ferromagnetic plates 608 and 610 having projections 612 and recesses 614 on their confronting surfaces, so as to define a set of magnetic flux paths of different reluctances at different horizontal locations. The magnetic field can be provided by one or more electromagnet coils 618 encircling the plates or encircling a magnetic flux return element 620 extending between the plates. A similar non-uniform field effect can be achieved using one plate with projections and one flat plate. Also, the recesses in one or both plates can be filled with a non-magnetic, paramagnetic or diamagnetic material. The analogous effect can be achieved applying an electric field through conductive plates having projections and recesses.

In the embodiments discussed above, the compression step used to enhance contact between the particles and conductivity is performed by squeezing the anisotropic layer between the microelectronic elements to be connected. However, other elements such as a pair of opposed platens or a pair of belts or rollers defining a nip, can be used to squeeze the layer. Also, a thermally-activated electrically conductive bonding material such as a solder, eutectic bonding alloy or diffusion bonding material can be provided on the surfaces of the particles. The bonding material can be activated when the particles are brought into engagement with one another, such as during or after the squeezing step. Also, the step of squeezing the layer may be performed concomitantly while the dielectric material of the layer is in a fluid condition. For example, where the dielectric material of the layer includes an uncured or partially cured epoxy, the heating step momentarily lowers the viscosity of the epoxy. The field is applied during this stage of the process. Continued heating brings the epoxy to a fully cured condition. The squeezing step may be applied during or after application of the field.

Figure 23:
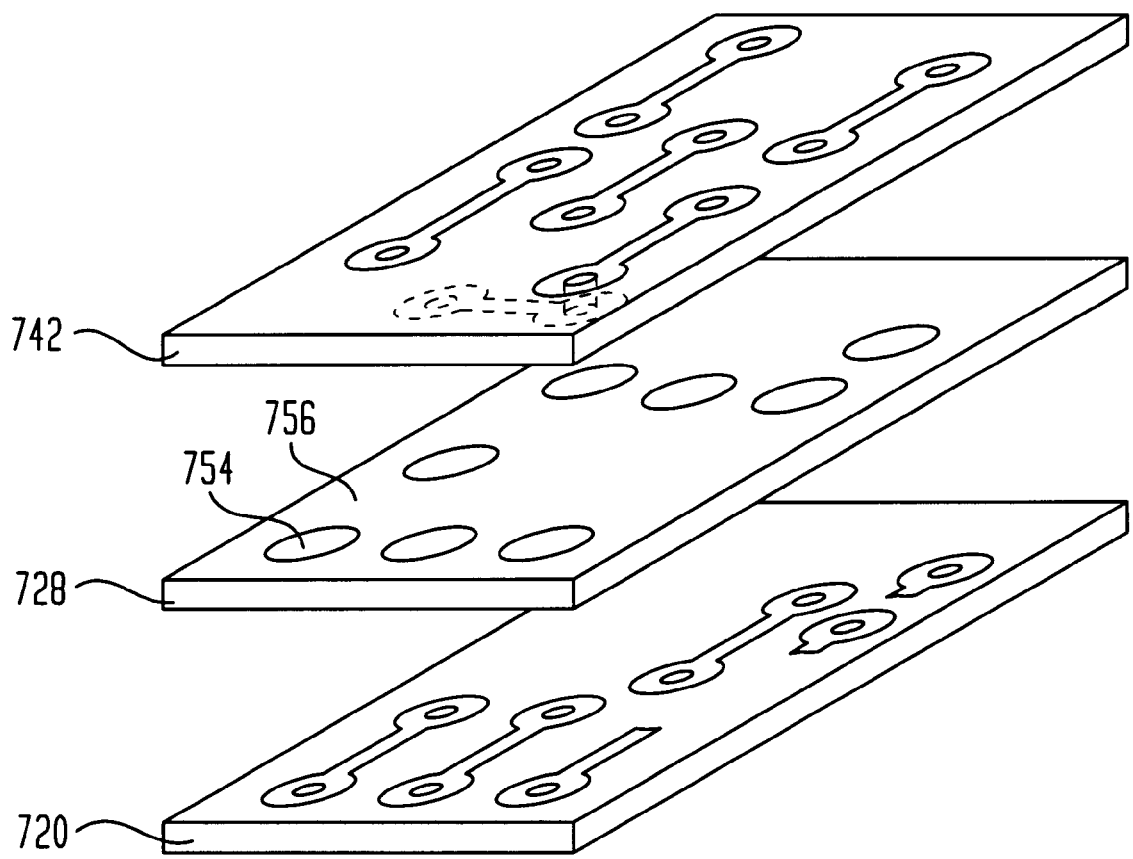
FIG. 23 shows an anisotropic conductive element assembled between multi-layer circuit panels according to another embodiment of the present invention.

In another embodiment of the present invention, an anisotropic conductive element made in accordance with the methods described above is utilized in multi-layer circuit assemblies, such as the assemblies disclosed in commonly assigned U.S. Pat. No. 5,282,312, the disclosure of which is hereby incorporated by reference herein. Referring to FIG. 23, a layer of anisotropic conductive material 728 is provided between circuit panels 720 and 742. A field is then applied to the layer 728 so as to alter the configuration of the conductive particles therein to provide areas of high particle concentration 754 and areas of low particle concentration 756. The areas of high particle concentration 754 provide electrical interconnections between the circuit panels 720 and 742.

As will be appreciated, numerous variations and combinations of the features discussed above can be utilized without departing from the present invention as defined by the claims. For example, the programming system described above may utilize either an electrical field or a magnetic field to program the layer of anisotropic conductive material. It is also contemplated that a combination of electrical and magnetic fields may be simultaneously utilized to program layers of anisotropic conductive material. Accordingly, the foregoing description of preferred embodiments should be taken by way of illustration rather than by way of limitation of the invention.

What is claimed is:

1. A method of making an anisotropic conductive element for use in microelectronic packaging comprising the steps of:

(a) providing a layer of a material having a pair of oppositely-directed major faces, said layer incorporating a curable dielectric material in a fluid condition and electrically conductive particles in said curable dielectric material;

(b) applying an electromagnetic field to said layer of a material so as to alter the configuration of said particles and so as to form areas of high particle concentration defining a plurality of conductive paths extending between the major faces of said layer; and (c) after the applying an electromagnetic field step, curing said dielectric material.

2. A method of making an anisotropic conductive element for use in microelectronic packaging comprising the steps of:

(a) providing a layer of a material having a pair of oppositely-directed major faces, said layer incorporating a curable dielectric material in a fluid condition and electrically conductive particles in said curable dielectric material; and (b) applying an electric field to said layer of a material so as to alter the configuration of said particles and so as to form areas of high particle concentration defining a plurality of conductive paths extending between the major faces of said layer, and (c) after the applying an electric field step, curing said curable dielectric material.

3. The method as claimed in claim 2 further comprising the step of setting said curable dielectric material to a non-fluid condition.

4. The method as claimed in claim 2, wherein said layer includes an anisotropic conductive material.

5. The method as claimed in claim 2 wherein said layer has the pair of oppositely-directed major faces and a vertical direction between said major faces, at least some of said particles being elongated and the applying an electric field step including turning the axes of elongation of at least some of said elongated particles toward the vertical direction.

6. The method as claimed in claim 5, wherein the applying an electric field step includes biasing said major faces with an electrical potential on at least some regions of said faces.

7. The method as claimed in claim 5, further comprising the step of compressing said layer in said vertical direction to provide low-resistance electrical paths between said at least some of the elongated particles.

8. The method as claimed in claim 5, further comprising the step of providing a substrate over at least one of said oppositely-directed major faces.

9. The method as claimed in claim 8, wherein said substrate includes a flexible dielectric film.

10. The method as claimed in claim 9, wherein said flexible dielectric film includes a polymeric material.

11. The method as claimed in claim 8, wherein said substrate includes a microelectronic element having a plurality of electrical contacts.

12. The method as claimed in claim 11, wherein said microelectronic element includes a semiconductor chip having a plurality of electrical contacts on the front face thereof.

13. The method as claimed in claim 2 wherein said layer has a pair of oppositely-directed major faces, a vertical direction between said major faces and horizontal directions parallel to said major faces, wherein the applying an electric field step includes moving at least some of said particles in horizontal directions.

14. The method as claimed in claim 13 wherein said electric field moves at least some of said particles in said horizontal direction so as to form said areas of high particle concentration interspersed with areas of low particle concentration.

15. The method as claimed in claim 14, further comprising the step of compressing said layer in said vertical direction to provide low-resistance electrical paths between said particles in said areas of high particle concentration.

16. The method as claimed in claim 2, wherein the curing step includes the step of heating said curable dielectric material.

17. The method as claimed in claim 16, wherein said curable dielectric material has a viscosity which is reduced during the heating step.

18. The method as claimed in claim 16, wherein said heating step and said applying an electric field step occur simultaneously.

19. The method as claimed in claim 2, wherein said dielectric material includes a silicone elastomer.

20. The method as claimed in claim 2, wherein said electrically conductive particles include one or more metals.

21. The method as claimed in claim 2, wherein said electrically conductive particles include non-conductive central cores coated with a conductive material.

22. The method as claimed in claim 21, wherein said non-conductive cores include a material selected from the group consisting of polymers and glass.

23. The method as claimed in claim 2, further comprising the step of applying a magnetic field.

24. A method of making a microelectronic package comprising the steps of:

(a) providing a microelectronic element including a plurality of electrical contacts on a first surface thereof;

(b) providing a layer of a material over said first surface of said microelectronic element, said material in said layer incorporating a dielectric material in a fluid condition and electrically conductive particles in said dielectric material;

(c) applying an electromagnetic field through said contacts to said layer of a material so as to alter the configuration of said electrically conductive particles.

25. The method as claimed in claim 24, wherein the applying an electromagnetic field step includes moving at least some of said particles into substantial alignment with one or more of said contacts so as to form areas of high particle concentration aligned with said contacts interspersed with areas of low particle concentration.

26. The method as claimed in claim 25, further comprising the step of setting said dielectric material to a non-fluid condition after the moving step.

27. The method as claimed in claim 26, wherein said layer of a material has a first major face and a second major face, further comprising the step of abutting a second microelectronic element having a plurality of electrical contacts with said second major face of said layer so that said contacts of said first and second microelectronic elements confront one another and are in substantial alignment with one another, said particles in said areas of high particle concentration electrically interconnecting one or more of said confronting contacts.

* * * * *

UNITED STATES PATENT AND TRADEMARK OFFICE
CERTIFICATE OF CORRECTION

PATENT NO. : 6,190,509 B1
DATED : February 20, 2001
INVENTOR(S) : Haba

It is certified that error appears in the above-identified patent and that said Letters Patent is hereby corrected as shown below:

In the Abstract Section, line 12, "last" should read -- least --.

Column 2,
Line 27, after "applying" insert -- of --.
Line 29, "potentials" should read -- potential --.
Line 66, before "preferably" insert -- to --.
Line 66, "provides" should read -- provide --.

Column 3,
Line 59, after "applying" insert -- of --.

Column 7,
Line 44, "1-100" should read -- 10-100 --.
Line 52, "remain" should read -- remains --.

Column 10,
Line 1, "provides" should read -- provide --.
Line 42, "are" should read -- is --.

Column 11,
Line 15, "flexible tape" should read -- substrate --.
Line 34, "bottom" should read -- first --.

UNITED STATES PATENT AND TRADEMARK OFFICE
CERTIFICATE OF CORRECTION

PATENT NO. : 6,190,509 B1
DATED : February 20, 2001
INVENTOR(S) : Haba

It is certified that error appears in the above-identified patent and that said Letters Patent is hereby corrected as shown below:

Column 12,
Line 14, after "achieved" insert -- , --.

Column 14,
Line 20, "includes" should read -- is corable to --.

Signed and Sealed this

Eighteenth Day of September, 2001

*Attest:*

*Attesting Officer*

NICHOLAS P. GODICI
*Acting Director of the United States Patent and Trademark Office*